United States Patent [19]
Chung

[11] Patent Number: 5,892,705
[45] Date of Patent: Apr. 6, 1999

[54] APPARATUS FOR MAINTAINING NON-VOLATILITY IN FERROELECTRIC RAMDOM ACCESS MEMORY AND METHOD THEREFOR

[75] Inventor: Il-sub Chung, Seoul, Rep. of Korea

[73] Assignee: Samsung Electronics Co., Ltd., Suwon, Rep. of Korea

[21] Appl. No.: 841,695

[22] Filed: Apr. 30, 1997

[30] Foreign Application Priority Data

Jun. 10, 1996 [KR] Rep. of Korea ................. 1996-20607

[51] Int. Cl.$^6$ ................................................. G11C 11/22
[52] U.S. Cl. .......................................... 365/145; 365/228
[58] Field of Search .................................. 365/145, 228

[56] References Cited

U.S. PATENT DOCUMENTS

| | | | |
|---|---|---|---|
| 4,873,664 | 10/1989 | Eaton, Jr. ................................. | 365/145 |
| 5,592,410 | 1/1997 | Verhaeghe et al. ...................... | 365/145 |
| 5,600,587 | 2/1997 | Koike ...................................... | 365/145 |
| 5,610,852 | 3/1997 | Koike et al. ............................. | 365/145 |
| 5,615,145 | 3/1997 | Takeuchi et al. ........................ | 365/145 |

Primary Examiner—David Nelms
Assistant Examiner—M. Tran
Attorney, Agent, or Firm—Foley & Lardner

[57] ABSTRACT

An apparatus and method for maintaining non-volatility in a ferroelectric random access memory (FRAM), in which recorded information is maintained during a power failure, are provided. The apparatus for maintaining non-volatility includes a control portion for a writeback function, a power source voltage sensing portion for sensing a failure in the power source voltage and providing a power failure signal to the control portion such that the control portion completes a writeback cycle before power failure. The power source voltage sensing portion generates a control signal by sensing a failure in power source voltage, and provides a power failure signal to the control portion such that a writeback process is completed before power failure, thereby maintaining non-volatility in the memory device. That is, loss of non-volatility in the memory device occurring during a power failure can be prevented by increasing the reliability of products.

9 Claims, 7 Drawing Sheets

APPARATUS FOR MAINTAINING NON-VOLATILITY IN FERROELECTRIC RAMDOM ACCESS MEMORY AND METHOD THEREFOR

BACKGROUND OF THE INVENTION

1. Field of the Invention

The present invention relates to an apparatus and method for maintaining non-volatility in a ferroelectric random access memory (FRAM) which enables preservation of recorded information during power failure.

2. Description of Related Art

Figure 1:
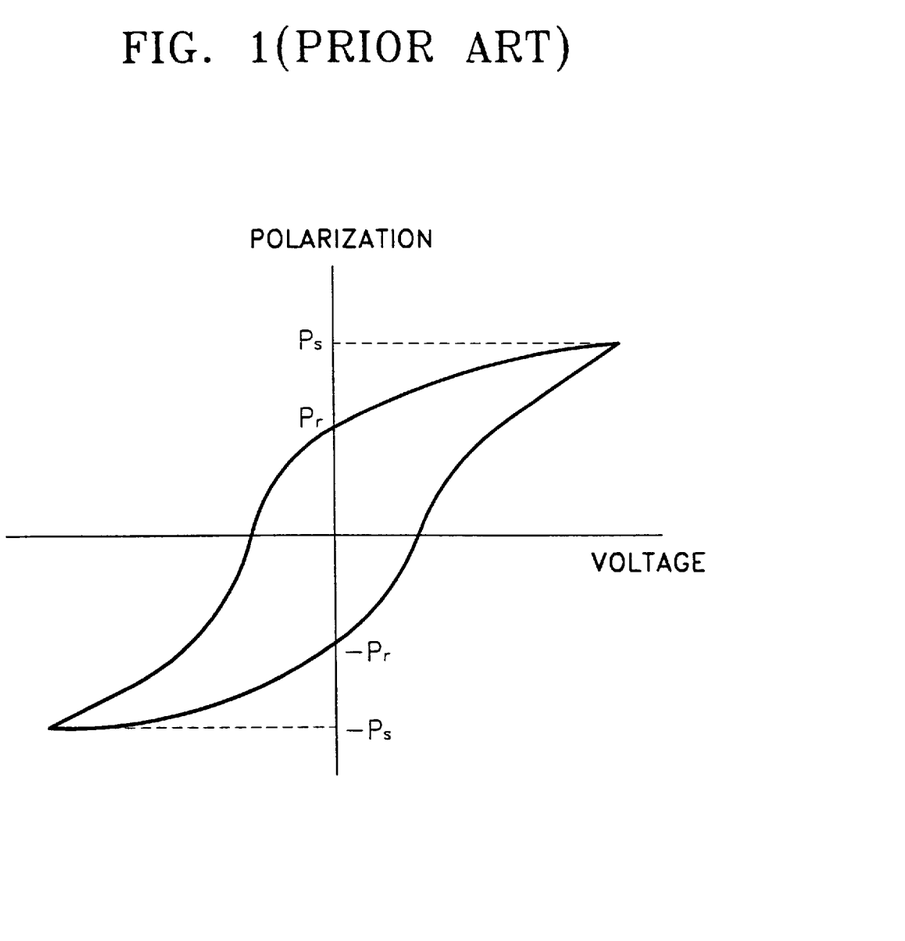
FIG. 1 is a hysteresis loop of a general ferroelectric material.
Figure 2:
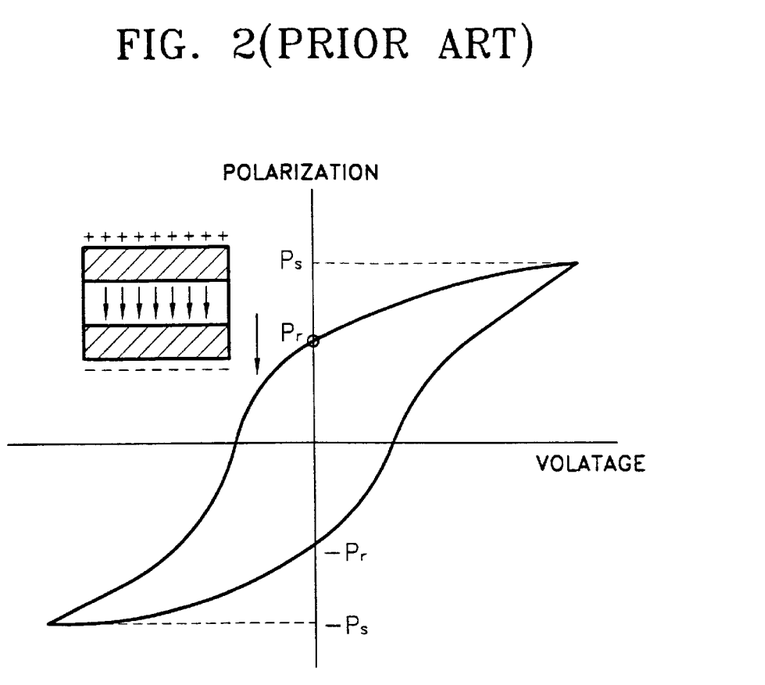
FIGS. 2 and 3 are diagrams illustrating the polarization state of the ferroelectric material according to the polarity of a voltage applied from a ferroelectric capacitor to an electrode based on the hysteresis loop shown in FIG. 1.
Figure 3:
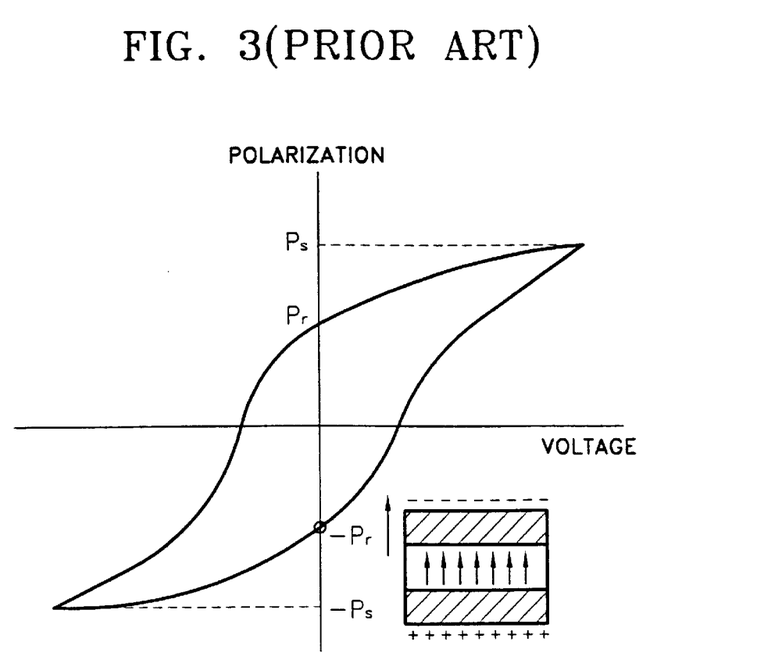

Generally, a FRAM is classified into two types: 1T-1C having a one-transistor, one-capacitor structure, and 2T-2C having a two-transistor, two-capacitor structure depending on the structure of a unit memory cell. Even though the structure of each FRAM is different, a ferroelectric capacitor as a constituent thereof operates under the same principle. Also, there is an advantage of non-volatility of recorded information in the FRAM since the polarization state of a ferroelectric material is maintained during a power failure. The polarization state changes according to the direction of an externally applied electrical field, and the change in polarity is shown in FIG. 1. That is, a ferroelectric material has two polarization states, +Pr and −Pr, during a power failure. Also, the two polarization states are changed according to the polarity of the voltage applied to a capacitor as shown in FIGS. 2 and 3. Thus, the FRAM operates in a different manner than other memory devices. As the most significant difference, the FRAM applies a read pulse to an electrode of the capacitors to distinguish the polarization states of the capacitors by polarity. In the FRAM adopting the above method of operation, the polarization state may be inverted after a read is completed.

The change in the polarization state of the ferroelectric material according to the polarity of the voltage will be described in detail as follows.

The ferroelectric material has two polarization states, +Pr and −Pr, during a power failure according to the polarity of the voltage provided just prior to the polarization, as shown in FIG. 1. Also, the degree of polarization representing the polarization state varies depending on the polarity of the voltage just previously applied to the capacitor and is represented by a hysteresis curve as shown in FIGS. 2 and 3. For example, the ferroelectric material is in the +Pr polarization state (corresponding to the upper portion of the hysteresis loop) when a positive (+) voltage is applied to the upper electrode of the capacitor with respect to the lower electrode, as shown in FIG. 2. On the contrary, the ferroelectric material is in the −Pr polarization state (corresponding to the lower portion of the hysteresis loop) when a positive (+) voltage is applied to the lower electrode of the capacitor with respect to the upper electrode, as shown in FIG. 3.

By changing the polarity of a voltage at both ends of the capacitor, a write information is accomplished in the ferroelectric capacitor so that its polarization state is the same as one of two polarization states shown in the hysteresis loop of FIG. 1. Also, a read pulse must be applied to the lower electrode of the capacitor in order to discriminate the polarization state (i.e. the information) written in the ferroelectric capacitor.

The reading process is as follows.

Figure 4:
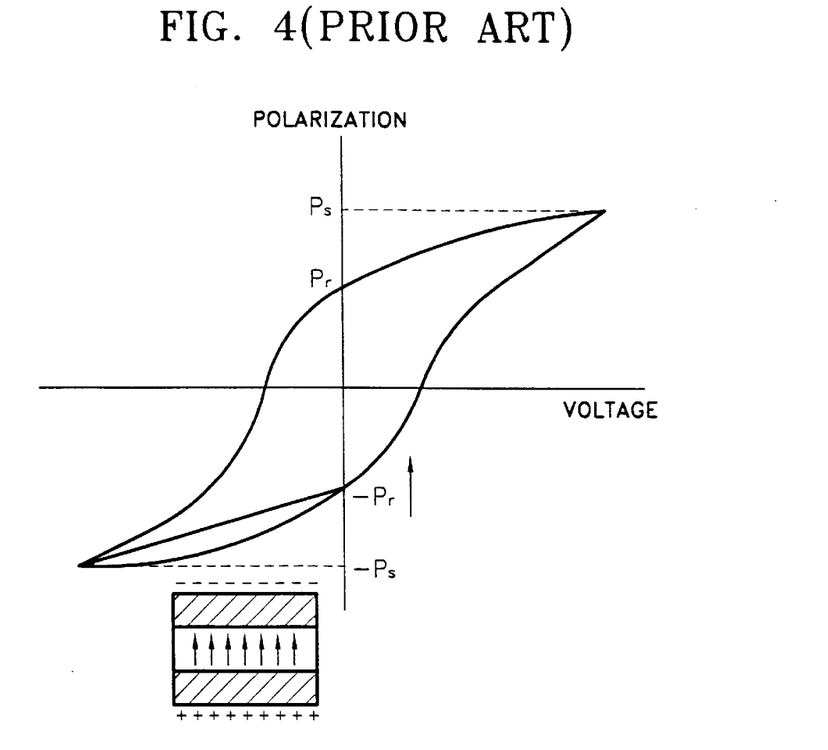
FIGS. 4 and 5 are diagrams illustrating a shift in the path of the polarization state on the hysteresis loop according to the polarity of a read pulse.

First, when a read pulse having the same polarity as that of a write pulse voltage is applied to the lower electrode of the ferroelectric capacitor, the polarization state is maintained without polarization switching by the read pulse, from -Pr to -Ps along the lower portion of the hysteresis loop as shown in FIG. 4. Here, the change of the polarization state along the hysteresis loop appears as an electrical charge amount at both ends of the electrode.

Figure 5:
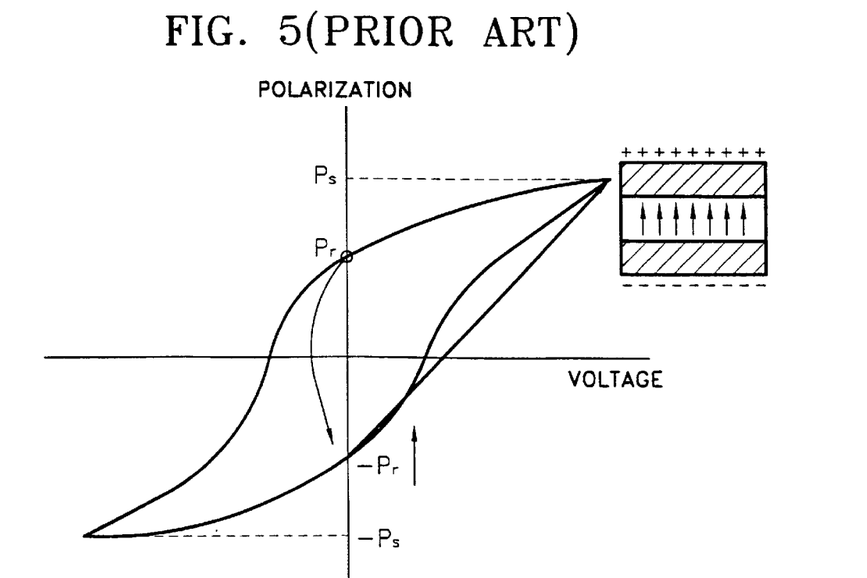
Figure 8:
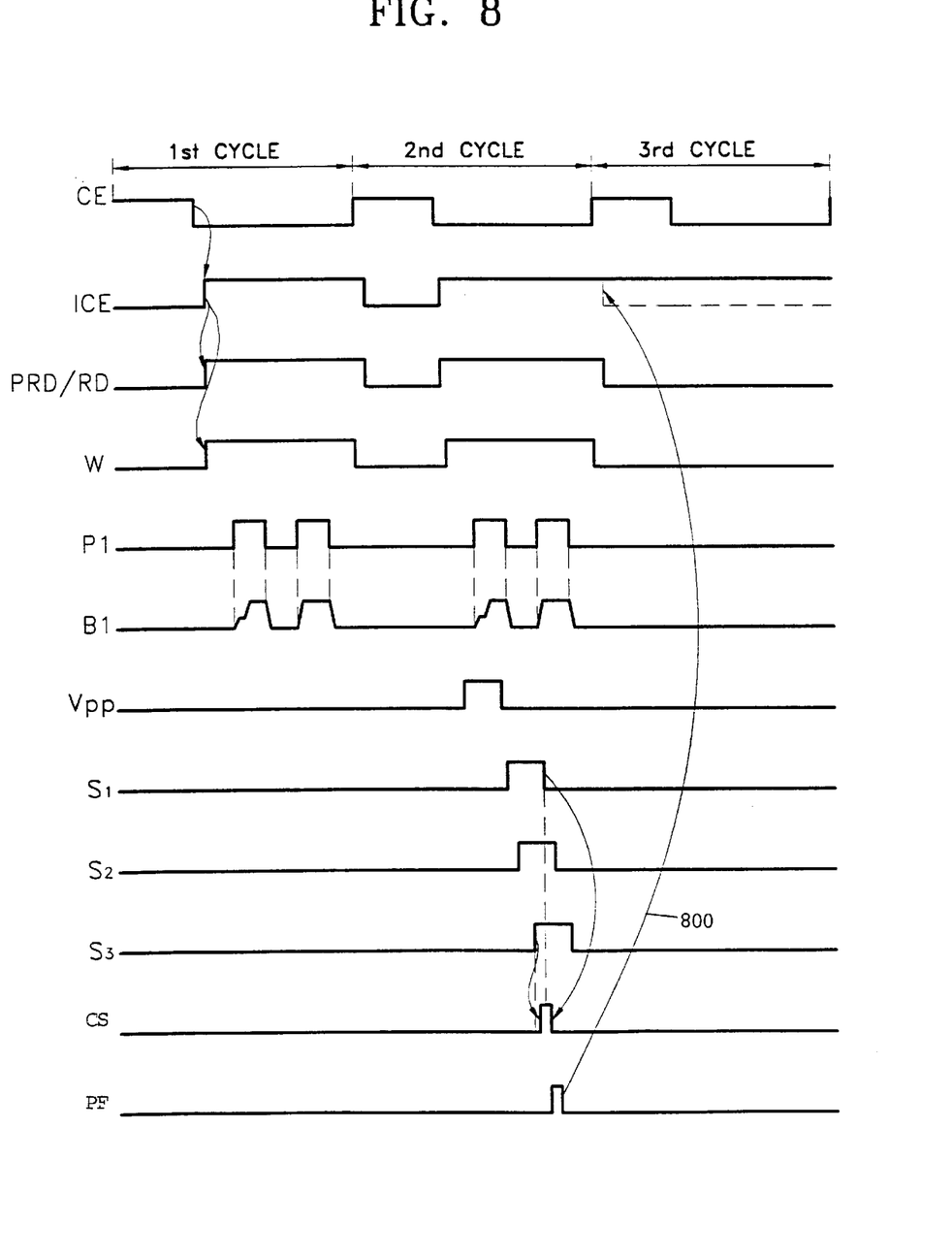
FIG. 8 is a timing diagram of operational signals in each element of the apparatus for maintaining non-volatility in the FRAM shown in FIG. 6.

On the contrary, when a read pulse having the opposite polarity to that of a write pulse is applied to the lower electrode of the ferroelectric material, the polarization state is changed through a polarization switching by the read pulse, from −Pr to +Pr along the hysteresis loop as shown in FIG. 5. The polarization state change by the switching (i.e. the change of polarity) corresponds to a destructive readout where recorded information is lost by the change of polarity. Thus, in the case of the destructive readout causing the change of polarity, a writeback process is required to turn back the polarization state to the initial state. If the writeback process is not completed, the polarization state is not recovered, and the information is lost. The writeback process is essential for the operation of the FRAM device so long as its circuit structure or reading method is not changed. Due to the polarity inversion caused when the polarity of the pulse applied for writing and that of the pulse applied for reading are different, an FRAM device in which two pulses are applied to a plate line has been developed by Ramtron Co. That is, according to the structure of the circuit developed by Ramtron Co., the first pulse as a read pulse determines the polarization state of the ferroelectric material and the second pulse as a writeback pulse restores the polarization state of data to the state before the reading process. For example, the first pulse of a signal P1 in FIG. 8 is for reading and the second pulse thereof is for the writeback. However, the ferroelectric memory device having the writeback function does not include a safety device for power failures. Accordingly, when the power supply is interrupted during the writeback, the polarization state cannot be completely recovered to the initial state, so that a destructive readout is performed resulting in a loss of data. That this error cannot be recovered is a fatal defect in the memory device. That is, the error in the writeback which is caused by the interrupt of the power supply takes non-volatility away from the FRAM, wherein non-volatility of the FRAM enables data to be kept during a power failure. Even though the probability that a power failure will occur during the writeback is low, the error in the writeback may be a fatal defect in the reliability of the product.

SUMMARY OF THE INVENTION

To solve the above problems, it is an object of the present invention to provide an apparatus and method for maintaining non-volatility in a ferroelectric random access memory (FRAM), which is capable of keeping recorded information by completing a writeback process even during a power failure.

According to an aspect of the present invention, there is provided an apparatus for maintaining non-volatility in a ferroelectric random access memory (FRAM) having control means for a writeback function in order to restore the original information before reading, the non-volatility maintaining apparatus comprising: a power source voltage sensing means for sensing a failure in the power source voltage and providing a power failure signal to the control means such that the control means completes a writeback cycle.

Preferably, the power source voltage sensing means comprises: a power sensing means for comparing the power source voltage with a reference voltage to determine whether a power voltage failure exists; and power failure signal generating means for generating a power failure signal according to a signal output from the power sensing means, the power failure signal generating means having a single-shot pulse generator for generating a plurality of single-shot clock signals according the signal output from the power sensing means, a delay means for delaying the plurality of single-shot clock signals, and an AND gate for performing an AND operation with respect to the plurality of single-shot clock signals each delayed by the delay means. The single-shot pulse generator may sequentially generate the remaining single-shot clock signals other than the first single-shot clock signal according to a signal which is generated by feeding back a previous single-shot clock signal to the power sensing means and output from the power sensing means.

According to another aspect of the present invention, there is provided a method for maintaining non-volatility in a ferroelectric random access memory (FRAM) in which a rewrite process is always processed after a read operation, the method comprising the steps of: (a) comparing a power source voltage with a reference voltage to determine whether a failure in the power source voltage exists or not; and (b) completing the restoration of read information and interrupting the following read cycle when a power source voltage failure is sensed in step (a).

Preferably, step (b) comprises the substeps of: (b-1) generating a plurality of single-shot clock signals when a power source voltage failure is sensed, wherein the remaining single-shot clock signals other than the first single-shot clock signal are sequentially generated according to a signal which is generated by feeding back a previous single-shot clock signal to the power sensing means and output from the power sensing means in the step (b-1); (b-2) delaying the plurality of single-shot clock signals; (b-3) generating a power failure signal by AND-operating the delayed single-shot clock signals; (b-4) completing the current one cycle of a writeback operation according to the power failure signal; and (b-5) interrupting a read cycle after the writeback operation.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 6:
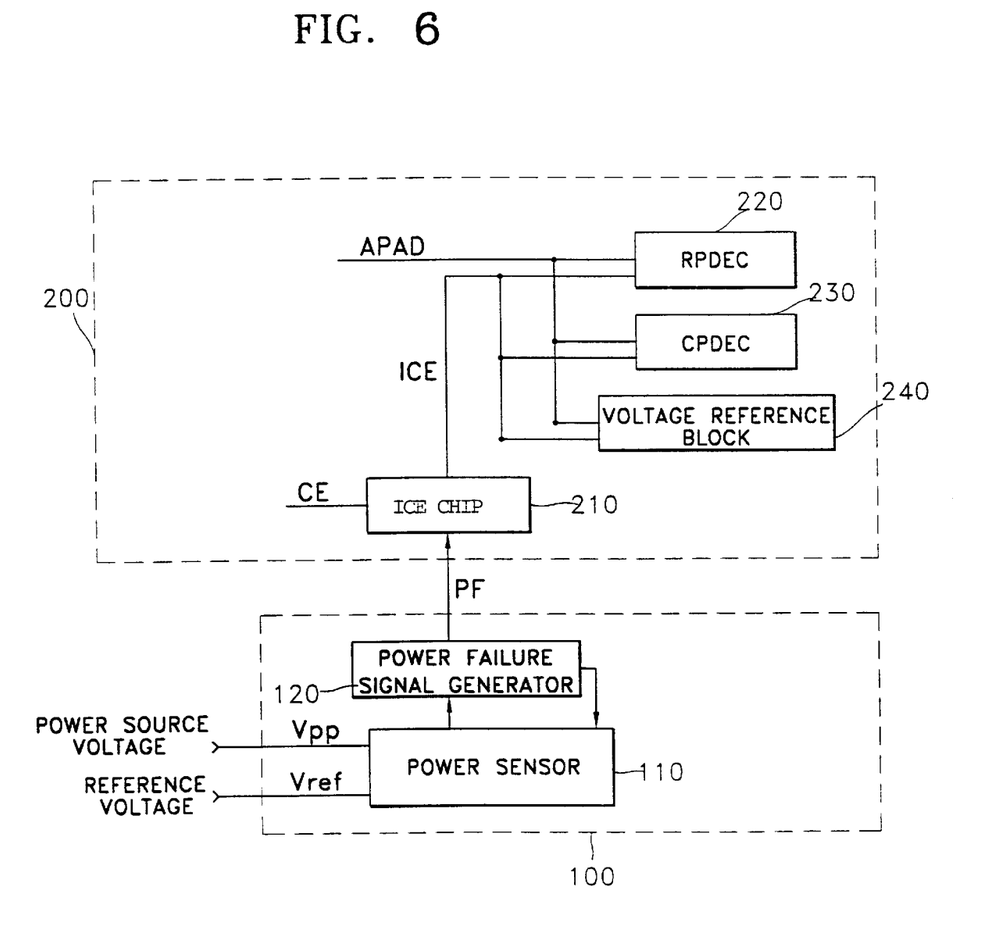
FIG. 6 is a schematic block diagram of an apparatus for maintaining non-volatility in a FRAM according to the present invention.

As shown in FIG. 6, an apparatus for maintaining non-volatility in a ferroelectric random access memory (FRAM) according to the present invention is roughly classified into two portions, that is, a power source voltage sensing portion 100 and a control portion 200.

The power source voltage sensing portion 100 as the characteristic portion of the present invention includes a power sensor 110 for comparing a power source voltage Vpp with a reference voltage Vref to sense whether the power source voltage is normal or not, and a power failure signal generator 120 for generating a power failure signal using a signal output from the power sensor 110. The power source voltage sensing portion 100 provides a power failure signal PF, which controls the writeback process to be completed during a power failure by sensing a failure in the power source before it occurs, to the control portion 200.

The control portion 200 includes a conventional internal chip enable (ICE) section of memory 210 including internal chips which are enabled according to a chip enable signal (CE), a row pre-decoder (RPDEC) 220, a column pre-decoder (CPDEC) 230 and a voltage reference block 240. The control portion 200 controls one cycle of the current writeback process to be completed during a power failure according to the power failure signal PF generated from the power source voltage sensing portion 100.

The circuit structure and operation of the power source voltage sensing portion 100 in the apparatus for maintaining non-volatility in a FRAM will be described with reference to FIGS. 7 through 9.

In the power source voltage sensing portion 100, the power sensor 110 functions as a power sensing means as described above. The power failure signal generator 120, as shown in FIG. 7, includes a plurality of (three) single-shot pulse generators 121, a delay portion 122 having a plurality of (three) delays, an AND gate 123 and a RS flip-flop 124. Three single-shot pulse generators 121 sequentially generate single-shot clock signals (SSCs; $S_1$, $S_2$, $S_3$) according to a signal output from the power sensor 110. The sequential generation of the single-shot clock signals will be described later. The SSCs are slightly delayed by the delay portion 122, then output as delayed single-shot clock signals $DS_1$, $DS_2$ and $DS_3$, respectively, as shown in FIG. 8. The AND gate 123 generates a control signal CS, as shown in FIG. 8, from the three delayed single-shot clock signals $DS_1$, $DS_2$ and $DS_3$ through an AND operation. Also, the RS flip-flop 124 receives the control signal CS to generate the power failure signal PF and provides the generated power failure signal PF to the ICE chip of the control portion 200 to set an ICE signal as "1".

The power failure signal generator 120 having the above structure operates as follows.

Figure 9:
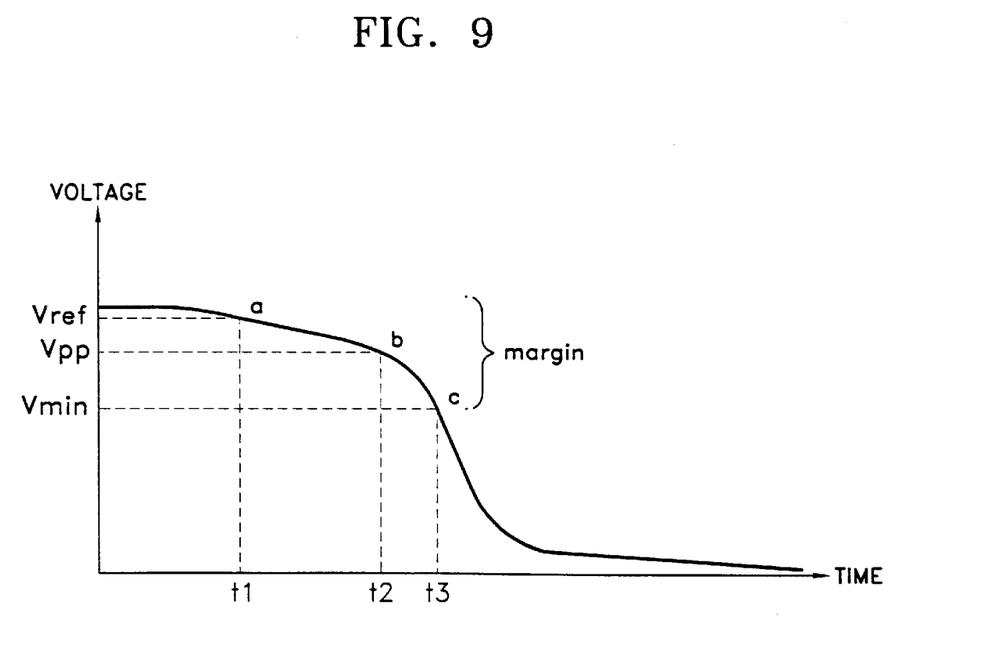
FIG. 9 is a graph showing the change in voltage with respect to time in the FRAM during a power failure.

In the apparatus for maintaining non-volatility in a FRAM according to the present invention, a reference voltage Vref is set to be slightly higher than the minimum voltage Vmin required to stably operate all circuits of the memory device as shown in FIG. 9. When a power source voltage Vpp having a voltage level lower than the voltage level of the reference voltage Vref is detected, a control signal for stopping the reading operation after completing only the current address cycle among the remaining address cycles is generated. The power failure signal generator 120 of the power source voltage sensing portion 100 adopts a multiple sensing method rather than a single sensing method in order to increase the reliability of the circuit, and thus, the generation of a false signal by the change of a power circuit is suppressed at maximum.

In detail, when a power supply voltage Vpp having a lower level than the reference voltage Vref is applied to the power sensor 110, the power sensor 110 senses a voltage failure in the power source, and the single-shot pulse generator 121 sequentially generates three single-shot clock signals $S_1$, $S_2$ and $S_3$ through the multiple sampling according to an abnormal signal output from the power sensor 110. The sequential generation of the single-shot clock signals will be described with reference to a feedback path shown in FIG. 7 and the single-shot clock signals $S_1$, $S_2$ and $S_3$ shown in FIG. 8.

The timing diagram of FIG. 8 shows the case that after a power failure is sensed during the first cycle of a CE signal, one address cycle (corresponding to the second CE cycle) is proceeded and then the remaining address cycles (corresponding to all the CE cycles after the third one) are disabled. The process for disabling the CE signal when the power failure occurs will be described as follows focusing on the single-shot clock signals $S_1$, $S_2$ and $S_3$.

During the first cycle of a CE signal, the power failure is sensed by the power sensor 110 and the single-shot pulse generator 121 generates a first single-shot clock $S_1$, Here, the first single-shot clock $S_1$ is fed back to the power sensor 110 to output a second single-shot clock $S_2$ when a power failure occurs. Also, the second single-shot clock $S_2$ is fed back to the power sensor 110 to output a third single-shot clock $S_3$ when a power failure occurs.

The timing diagram of FIG. 8 shows the case of three samplings, and accordingly, the single-shot clocks $S_1$, $S_2$ and $S_3$ are output sequentially according to each sequential sampling. The sequential sampling is for preventing an address lock caused by a similar phenomenon to the power failure, which is very important in the operational reliability of the device. In order to generate a power failure signal PF from the power sensor 110 as a result of sensing a voltage failure in the power source, the characteristics related to the voltage failure should be considered preferentially. As shown in FIG. 9, when a power failure occurs, the voltage slowly decreases to the minimum voltage Vmin and then sharply decreases after passing the minimum voltage. Considering the above voltage characteristics, a reference voltage Vref used for sensing the power failure (i.e. voltage failure) is set. Here, it is preferable to set a reference voltage as low as possible; however, a time and voltage margin required for stable operation of the control portion 200 should be considered. Also, in terms of reliability, the possibility of generating an error signal due to a change in voltage should also be considered. To solve and avoid these problems, characteristics related to a power failure and changes in power source voltage should be discriminated.

Generally, a change in power source voltage that would have a negative influence on the memory occurs within a short period of time while it takes a comparatively longer period of time to reach a power failure that would have a negative influence on the memory. Using this difference, a change in power source voltage occurring within a short period of time can be discriminated from a real failure of the power source voltage through multiple samplings. In other words, a control signal is generated only when all power source voltage samplings are lower than the reference voltage. Meanwhile, the other case is regarded as a similar phenomenon to the power failure and the control signal is not generated in this case. Thus, an error in the sensing of a power failure can be prevented through multiple samplings.

However, the number of samplings is preferentially limited to a number that can be performed within a usable time based on the power failure characteristics. The greater the number of samplings the better; however, it is preferable to perform three to four samplings from the standpoint of reliability, usable time and voltage margin for stable operation. If all results from the multiple samplings coincide with each other, a power failure signal PF is generated to disable all remaining address cycles. Also, a sufficient time is required such that the control by the power failure signal PF is completed within the operation time. Thus, the reference voltage for sensing the change of the power source voltage and the sensing time should be considered for rapid and accurate operation.

When designing a circuit, the time $(t_3-t_1)$ required for the power voltage to decrease to the minimum voltage capable of operating a circuit of the memory device and the time $(t_3-t_2)$ required until the address cycles are disabled by the operation of the control circuit should be considered. The power source voltage Vpp is set in consideration of the delay time at the minimum voltage Vmin. When the power source voltage Vpp is set, a reference voltage Vref used for sensing the power failure is set from the power failure characteristic curve shown in FIG. 9. Here, as described above, the reference voltage Vref is set to maximize the difference from the power source voltage such that multiple samplings (in the above example, three times) are possible within a usable time.

In FIG. 9, "a" represents a reference voltage Vref for sensing the power failure, and "c" represents the minimum voltage Vmin required for stably completing one address cycle of a control circuit. Also, "b" represents the power voltage Vpp set in consideration of a delay at the minimum voltage, wherein the delay occurs during the operation of the circuit. Here, the sensing of the power failure and the application of a control signal should be performed within the time $(t_2-t_1)$ from the reference voltage to the power source voltage. When considering the power failure characteristic of a real power circuit, the usable time is known to be about several hundreds milliseconds, e.g., about 200~400 ms, and after dividing the usable time into two portions to sense the power failure in the first half portion, at least one address cycle is completed in the second half portion using a control signal. Here, at least the minimal time is allocated for the operation in the second half portion in consideration of the time required therefor, and the remaining usable time is allocated to the multiple sensing in order to increase the reliability in the sensing of the power failure. For example, assuming that a cycle time is 100 ns, at least 100 ns of time is required for a stable one cycle of reading including a writeback process. When summing the time required for the operation of the control circuit within a cycle time to a delay time, a time $(t_3-t_2)$ required for the operation in the second half portion is obtained. Here, the usable time for the multiple sensing and a time required for sensing the power source voltage are summed $(t_2-t_1)$. In division of the time, when a time source Voltage required for decreasing the voltage from 4.3V to 3.8V is about 200 ms, several milliseconds of time is required for one cycle of reading operation. Thus, 100~150 ms of time is allocated to the sensing portion in order to increase the reliability of the control signal. If 100 ms of time is allocated for sensing power source voltage, three sensing processes can be performed during the 100 ms, where each sensing process has about a 30 ms period.

Also, the single-shot clocks SSCs output from the single-shot pulse generator 121 are delayed by the delay portion 122 to be delayed output single-shot clocks $DS_1$, $DS_2$ and $DS_3$ as shown in FIG. 8. When the delayed single-shot clocks $DS_1$, $DS_2$ and $DS_3$ are simultaneously sensed by the AND gate 123, the failure in the power source voltage is detected to generate a control signal CS. Accordingly, the control signal CS is provided to the ICE chip 210 via the RS flip-flop 124 as a power failure signal PF, thereby suppressing the generation of an ICE signal at a falling edge. That is, as shown in FIG. 8, after a cycle is performed once more (the second cycle of the CE signal), a CE signal is synchronized by the power failure signal PF at a rising edge of the third cycle to reset the ICE signal, so that a falling edge of the ICE signal is not generated in the third cycle, see FIG. 8, item 800. If the falling edge is not generated, cell access signals are not synchronized by the ICE signal, so that the cell cannot be accessed. When the power failure signal PF generated by the above process is provided to the control portion 200 via the RS flip-flop 124, one cycle including a writeback process is completed and the remaining address cycles are not. By complementing the above function, a loss of data does not occur. As described above, the power failure signal PF generated from the power failure signal generator 120 for the cycle control performs only one cycle of reading via the control portion 200 and stops the process of the remaining address cycles. That is, for high reliability of the device, the multiple samplings are performed when a power failure occurs as described above. If a control signal is generated from one sampling result with respect to a reference voltage, errors which may be generated by a false control signal such as a spike or a fluctuation, which frequently occurs in a real power circuit, increases because the false control signal is not easily distinguished from power source voltage failure waveforms, and the reliability decreases, to thereby increase the chances of error in determining whether there is a power source voltage failure.

The restoration process by the power failure signal PF in the control portion 200 is as follows.

As described above, the PF signal having a rare frequency in the generation of error ensures at least one cycle of the writeback when the power source voltage Vpp is maintained stably between the reference voltage Vref and the minimum voltage Vmin, preventing a destructive readout. The control portion 200 provides the power failure signal PF generated from the power source voltage sensing portion 100 to a conventional circuit such that the reading cycle is not performed after one stable cycle is performed. That is, the power failure signal PF is applied to the ICE chip 210 of the control portion 200 after sensing the power voltage failure, one cycle including the writeback process is completed and the remaining address cycles are not processed.

In detail, the operation of the FRAM shown in FIG. 6 based on the circuit structure of a general memory device and the operation thereof is started by applying a chip enable signal (CE) shown in FIG. 8 to the ICE chip 210, which enables the chip operation by controlling an externally applied address signal of the chip via an address pad APAD. In order to control an internal circuit, an internal chip enable (ICE) signal shown in FIG. 8 is generated using the CE signal. The ICE signal is provided to the RPDEC 220 and the CPDEC 230 using a synchronous control method to generate a cell select signal such as a wordline signal and a bit line signal, thereby operating the ICE chip. Thus, it the ICE signal is not generated, a cell access is not performed even though the address signal enters from an external source, so that an address is maintained at a disable state. The power failure signal PF prevents the generation of the ICE signal, so that a minimum memory state can be maintained, and information can be read correctly after the power source is reapplied. Thus, since information loss by reading can be restored via the writeback cycle during a power voltage failure, the non-volatility of the FRAM can be secured.

Figure 7:
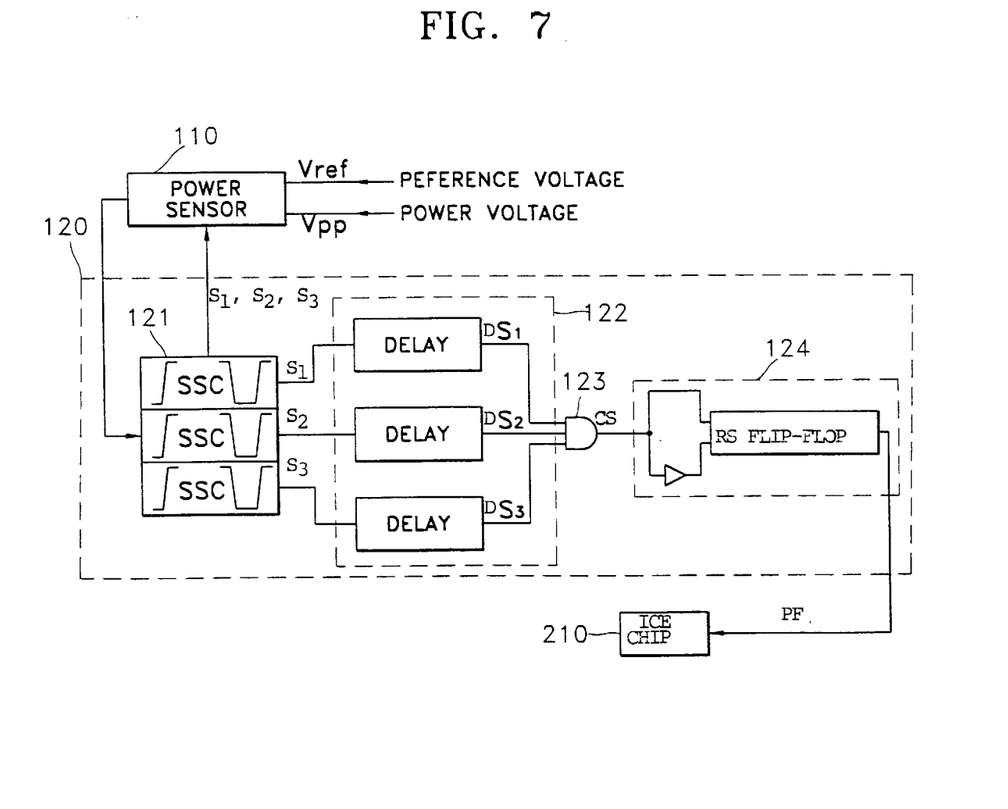
FIG. 7 is a detailed block diagram of the power failure signal generator of the apparatus for maintaining non-volatility shown in FIG. 6.

Referring to FIG. 7, the above-described operation will be described briefly as follows.

When the power source voltage failure is sensed as the result of comparison between the power source voltage and the reference voltage, single-shot pulses are output and then delayed in the delay portion 122 for a predetermined time to be compared with the outputs by subsequent samplings. Then, the AND gate 123 generates a control signal CS when all signals obtained through the samplings are coincident. An RS flip-flop uses the control signal CS to generate the power failure signal PF, which is then provided to the ICE chip 210 to reset the ICE signal which is output after being synchronized by the externally provided CE signal. The generation of a falling edge suppressed by the reset of ICE signal and the generation of column and row signals for selecting a cell are prevented, so that an external address signal is internally disabled.

As described above, the apparatus for maintaining non-volatility in a FRAM according to the present invention senses the power failure. The apparataus for maintaining non-volatility including a power source voltage sensing portion for generating a control signal and a control portion constituted by a conventional memory circuit which controls to completely perform only one current address cycle among the address cycles using the control signal generated from the power source voltage sensing portion. The power source voltage sensing portion generates a control signal by sensing a failure in the power supply voltage before it occurs, and provides the control signal to the control portion such that a writeback process is completed, thereby maintaining non-volatility in the memory device. That is, loss of original function in the non-volatile memory device, which may be caused during a power failure, can be prevented, thereby increasing the reliability of ther product.

The Korean Application No. 96-20607, filed on Jun. 10, 1996, is incorporated by reference herein.

What is claimed is:

1. An apparatus for maintaining non-volatility in a ferroelectric random access memory (FRAM) having a control means for ensuring a writeback cycle restores an original information before a next read process initiates, the apparatus comprising:

power source voltage sensing means for sensing a failure in a power source voltage, and for providing a power failure signal to the control means such that the control means is forced to complete the writeback cycle, wherein the power source voltage sensing means comprises:

power sensing means for comparing the power source voltage with a reference voltage to determine whether a power voltage failure exists; and power failure signal generating means for generating the power failure signal according to a signal output from said power sensing means.

2. The apparatus for maintain non-volatility in a FRAM of claim 1, wherein the power failure signal generating means comprises:

a single-shot pulse generator for generating a plurality of single-shot clock signals according to the signal output from said power sensing means;

delay means for delaying each of the plurality of single-shot clock signals; and an AND gate for performing an AND operation with respect to the plurality of single-shot clock signals delayed by the delay means.

3. The apparatus for maintaining non-volatility in a FRAM of claim 2, wherein the single-shot pulse generator sequentially generates the plurality of single-shot clock signals according to a feed-back of a previous single-shot clock signal to the power sensing means.

4. A method for maintaining non-volatility in a ferroelectric random access memory (FRAM) wherein a writeback operation always follows a read operation, the method comprising the steps of:

(a) comparing a power source voltage with a reference voltage to determine whether a failure in a power source voltage exists; and (b) completing the writeback operation and interrupting a following read cycle, when the failure is determined in the step (a), wherein the failure in the power source voltage is determined when the power source voltage is lower than a reference voltage.

5. A method for maintaining non-volatility in a ferroelectric random access memory (FRAM) wherein a writeback operation always follows a read operation, the method comprising the steps of:

(a) comparing a power source voltage with a reference voltage to determine whether a failure in a power source voltage exists; and (b) completing the writeback operation and interrupting a following read cycle, when the failure is determined in the step (a), wherein the step (b) comprises the substeps of:

(b-1) generating a plurality of single-shot clock signals when the failure is determined;

(b-2) delaying the plurality of single-shot clock signals;

(b-3) generating a power failure signal by AND-operating the plurality of single-shot clock signals delayed in the substep (b-2);

(b-4) completing the writeback operation according to the power failure signal; and (b-5) interrupting the following read cycle after the writeback operation.

6. The method of claim 5, wherein the plurality of single-shot clock signals, other than a first single-shot clock signal, are sequentially generated according to a feed-back signal of a previous single-shot clock signal to a power sensing means in the step (b-1).

7. An apparatus for maintaining non-volatility in a ferroelectric random access memory (FRAM) having a control unit that is configured to operate a writeback cycle to restore an original information before a next read process initiates, the apparatus comprising:

a power source voltage sensor that senses a failure in a power source voltage, and provides a power failure signal to the control unit such that the control unit is forced to complete the writeback cycle, wherein the power source voltage sensor comprises:

a power sensor that compares the power source voltage with a reference voltage to determine whether a power voltage failure exists; and a power failure signal generator that generates the power failure signal according to a signal output from the power sensor.

8. The apparatus of claim 7, wherein the power failure signal generator comprises:

a single-shot pulse generator that generates a plurality of single-shot clock signals according to the signal output from the power sensor;

a delay unit that delays each of the plurality of single-shot clock signals; and an AND gate that performs an AND operation on the plurality of single-shot clock signals as delayed by the delaying unit.

9. A ferroelectric random access memory (FRAM) device including a ferroelectric material whose polarization is maintained even when no power is supplied to the FRAM device, the FRAM device comprising:

a control unit that operates, during normal operation of the FRAM device, to perform a writeback process that switches the polarization of the ferroelectric material back to an original state before a next read cycle is initiated; and a power source voltage sensor that senses a failure in a power source voltage, and provides a power failure signal to the control unit, such that the control unit completes the writeback process before power to the FRAM device falls below a predetermined threshold voltage level.

* * * * *